United States Patent [19]

Izzard et al.

[11] Patent Number: 5,506,874
[45] Date of Patent: Apr. 9, 1996

[54] PHASE DETECTOR AND METHOD

[75] Inventors: Martin J. Izzard, Dallas; David B. Scott, Plano, both of Tex.

[73] Assignee: Texas Instruments Incorporated, Dallas, Tex.

[21] Appl. No.: 146,680

[22] Filed: Nov. 1, 1993

[51] Int. Cl.[6] ..................................................... H03D 1/00
[52] U.S. Cl. .................. 375/340; 375/376; 324/2
[58] Field of Search .............................. 375/81, 120, 94, 375/110; 328/109, 133; 307/510, 511

[56] References Cited

U.S. PATENT DOCUMENTS

| | | | |
|---|---|---|---|
| 4,267,514 | 5/1981 | Kimsey | 328/133 |
| 4,400,667 | 8/1983 | Belkin | 375/120 |
| 4,422,176 | 12/1983 | Summers | 375/120 |
| 4,535,459 | 8/1985 | Hogge, Jr. | 375/80 |
| 4,773,085 | 9/1988 | Cordell | 375/120 |
| 4,789,996 | 12/1988 | Butcher | 375/120 |
| 4,975,660 | 12/1990 | Svenson | 375/120 |
| 5,027,085 | 6/1991 | DeVito | 375/120 |
| 5,056,120 | 10/1991 | Taniguchi et al. | 307/510 |
| 5,120,602 | 6/1992 | Lee et al. | 307/511 |
| 5,233,636 | 8/1993 | Lee et al. | 375/120 |

OTHER PUBLICATIONS

Pottbacker et al., "A Si Bipolar Phase and Frequency Detector IC for Clock Extraction up to 8 Gb/s", *IEEE Journal of Solid–State Circuits*, vol. 27, No. 12, Dec. 1992, pp. 1747–1751.

Lee et al., "A 155–MHz Clock Recovery Delay– and Phase–Locked Loop", *IEEE Journal of Solid–State Circuits*, vol. 27, No. 12, Dec. 1992, pp. 1736–1746.

*Primary Examiner*—Stephen Chin
*Assistant Examiner*—T. Ghebretinsae
*Attorney, Agent, or Firm*—Ira S. Matsil; James C. Kesterson; Richard L. Donaldson

[57] ABSTRACT

A phase detector 10 is disclosed herein. A clock signal CLK (OR I), a marker signal MARK (or Q) and a data signal D are provided. The data signal may comprise a periodic clock signal. Sampler circuitry 50 receives the clock signal CLK, the marker signal MARK and the data signal D and generates a sampled clock signal and a sampled marker signal. Sign modifier circuitry 52 then receives the sampled clock signal and sampled marker signal and generates first and second command signals. Select circuitry 54 receiving these command signals selects a valid command signal based upon the data signal.

27 Claims, 6 Drawing Sheets

PHASE DETECTOR AND METHOD

FIELD OF THE INVENTION

This invention generally relates to a data retiming circuit and specifically to a phase detector which can be used with a half-baud clock and serial data.

BACKGROUND OF THE INVENTION

A phase detector is a circuit which compares the phase of one signal with the phase of another. One common application is in phase lock loops where the phase detector is coupled in a loop with a filter and a voltage controlled oscillator. This circuit can be used to control the frequency and phase of a desired signal.

Most phase detection for use with serial data require a full baud clock. One example of a phase detector is a Hogge detector. This circuit works by splitting the data bit into two and measuring the width of the two halves. An example of this type of circuit is disclosed in the paper found on page 1736 of IEEE JSSC, volume 27, number 12, December 1991, incorporated herein by reference.

Another phase detector is the sampling phase detector. This circuit produces a beat note which is utilized in the phase detection process. An example of a sampling phase detector is described in the paper found on page 1747 of IEEE JSSC, volume 27, number 2, December 1992, incorporated herein by reference.

SUMMARY

The present invention provides a method and circuit for a phase detector which can operate with a clocking frequency less than or equal to the maximum data frequency, i.e., one half the baud rate.

In one aspect of the present invention, a reference clock in quadrature with the main clock is used to discriminate between phase error signals at the rising edge and those generated at the falling edge of the clock.

A phase detector is disclosed herein. A clock signal, a marker signal and a data signal are provided. Sampler circuitry receives the clock signal, the marker signal and the data signal and generates a sampled clock signal and a sampled marker signal. Sign modifier circuitry then receives the sampled clock signal and sampled marker signal rand generates first and second command signals. Select circuitry receiving these command signals selects a valid command signal based upon the data signal.

An advantage of the invention is that it allows a loop using this phase detector to produce a clock of half the frequency that which is normally needed. For example, with a 3 Gbit/sec data rate, a 1.5 GHz clock can be produced. This means that only a considerably lower speed circuit is required to produce the clock. Since the retiming elements and phase detector elements do not see the full speed clock directly, these elements have more settling time.

The present invention can be implemented in a number of applications. For example, all integrated circuits which need to retime (clock) high speed serial data can be benefitted. This benefit would be especially useful in telecommunications applications.

BRIEF DESCRIPTION OF THE DRAWINGS

The above features of the present invention will be more clearly understood from consideration of the following descriptions in connection with accompanying drawings in which.

DETAILED DESCRIPTION OF PREFERRED EMBODIMENTS

The making and use of the presently preferred embodiments are discussed below in detail. However, it should be appreciated that the present invention provides many applicable inventive concepts which can be embodied in a wide variety of specific contexts. The specific embodiments discussed are merely illustrative of specific ways to make and use the invention, and do not limit the scope of the invention.

The following is a description of the circuit and method of the present invention. The preferred embodiment will be described first followed by a description of modifications. A more generalized look at the circuit will then be taken followed by a description of alternate embodiments. Applications for using the invention will then be described.

Figure 1:
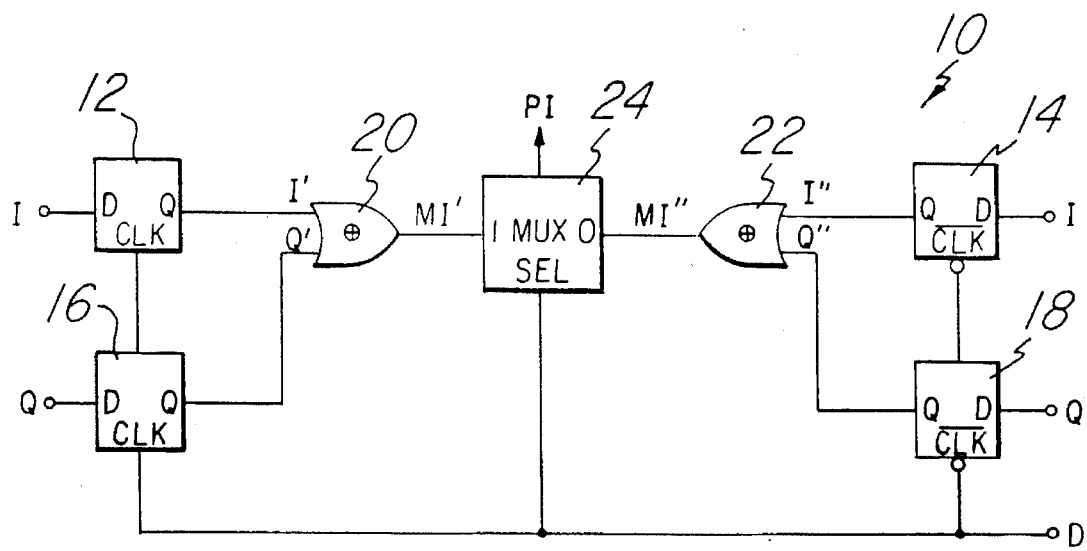
FIG. 1 is a schematic diagram of a first embodiment phase detector.

Referring first to FIG. 1, a first preferred embodiment phase detector 10 is illustrated in schematic form. The phase detector receives two input signals I and D and outputs a signal PI which is at one voltage level if I changes level (e.g., I goes from high voltage level to a low voltage or vice versa) before D changes level and another voltage level if I changes level after D changes level. The clocking signal Q is preferably the quadrature representation of clocking signal I, i.e., Q is about 90 degrees out of phase with I. When Q is about ninety degrees out of phase with I, the range of the phase detector 10 is maximized. The signal Q may typically be generated from the signal I with a controlled delay.

The advantages of the present invention will be more readily apparent from the discussions below. However, first a description of the first preferred embodiment phase detector circuit 10 will be presented.

Input signal I is applied to the input of latch 12 and of latch 14. Latch 12 generates sampled clock signal I' which is the same as input I when the signal D applied to clocking input CLK is low but holds input I when the signal applied to clocking input CLK is high. Conversely, latch 14 generates sampled clock signal I" which is the same as input I when signal D applied to clocking input CLK is high while it holds input I when the signal D applied to clocking input CLK is low.

Similarly, input signal Q is applied to the input of latch 16 and also to the input of latch 18. Latch 16 works in the same manner as latch 12 and latch 18 works in the same manner as latch 14. Latch 16 generates sample marker signal Q' while latch 18 generates sample marker signal Q".

In general, latches 12–18 serve as samplers which generate the desired sample at the transition of the signal D. Other circuitry can be substituted for the latches as will be discussed below.

Sample signals I' and Q' are input to XOR gate 20. The output of XOR 20 is coupled to the first data input of multiplexer 24. Similarly, sample signals I" and Q" are coupled to XOR gate 22. XOR gates 20 and 22 provide one method of modifying the sign of the sample of I according to which edge of I (rising or falling) the data D transition is near. Other methods can be used. Of course, as is well known in the art, two AND gates and an OR gate can be interconnected to provide the XOR function.

The output of XOR gate 22 is coupled to the second data input multiplexer 24. The input signal D is coupled to the select input of multiplexer 24. Multiplexer 24 provides one method of choosing between the two command signals MI' and MI" depending upon which is selected. Other circuitry could be used to accomplish this same function.

Figure 4:
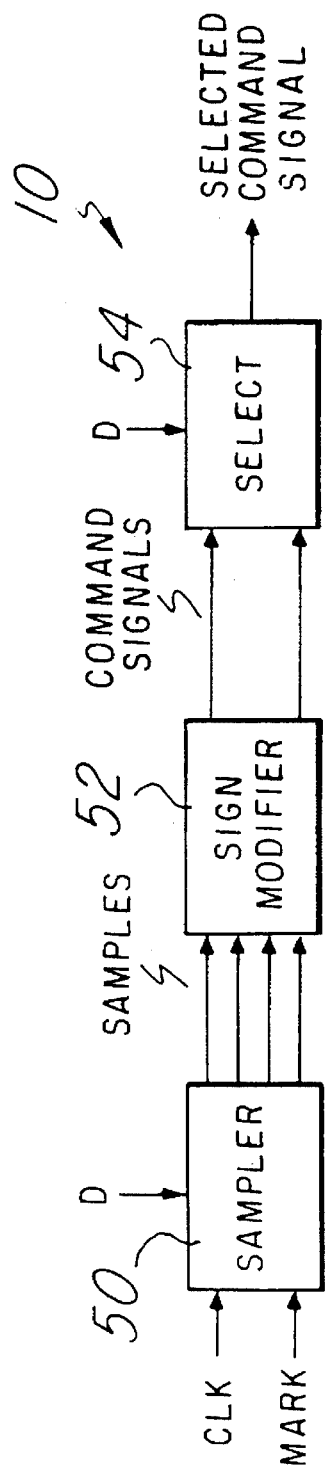
FIGS. 4 and 5 are block diagrams which illustrate the general concept of an aspect of the invention.
Figure 5:
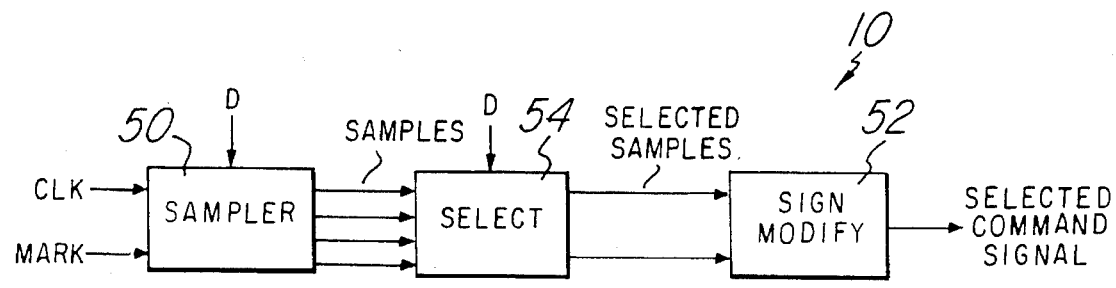

A more generalized look at the possible circuitry will taken in the discussion of FIGS. 4 and 5. But first it will be worthwhile to take a look at the operation of the circuit.

Figure 2:
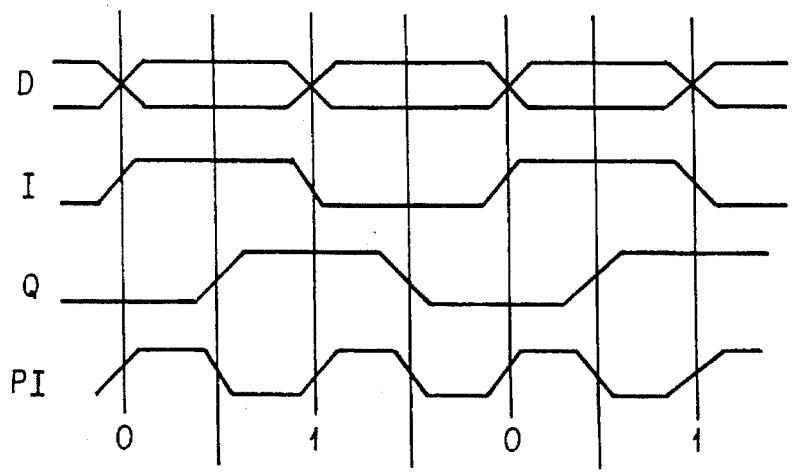
FIG. 2 is a timing diagram which is useful in understanding the operation of the circuit of FIG. 1.
Figure 3:
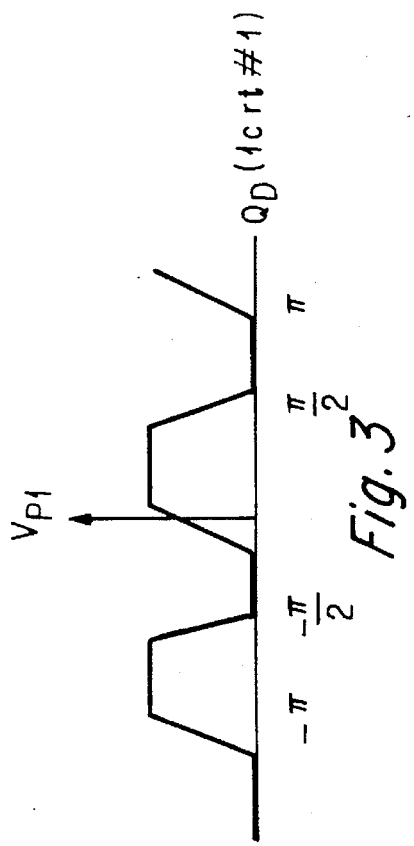
FIG. 3 is a phase detector characteristic diagram which illustrates the range of the phase detector.

The operation of phase detector circuit 10 will best be understood with reference to the diagrams of FIG. 2 and 3. In these figures, the signal D is an arbitrary stream of digital signals and the signal I is a clocking signal which is to be aligned to the transitions of signal D.

In one application which could utilize this phase detector 10, the signal D is a data stream at a given baud rate. The maximum frequency of the data stream is known to be half the baud rate. Unlike prior art systems, the clocking signal I is a half-baud clock as opposed to a full-baud clock as was previously required.

The latches 12–18 sample I and Q on a transition of signal D. If Q was high, the I sample is not inverted by the XOR gate 20 (or 22). On the other hand, if Q was low, the I sample is inverted. In other words, if Q is high, the falling edge of I will be aligned to the transition in D and when Q is low, the rising edge of I will be aligned with the transition in D. The multiplexer 24 output is therefore the detector output indicating, if high, that the clock I is late and if low that the clock is early.

To maximize the range of the phase detector, it is desirable that I and Q be ninety degrees out of phase. However, in general, the phase difference between I and Q must only be greater than the phase difference (or jitter) between D and I for the circuit to operate properly. Accordingly, phase differences other than ninety degrees can be used.

The left sampler which includes latches 12 and 16 operates on the rising edge (i.e., a transition from "low" to "high") of a D transition, and the multiplexer 24 presents the output from the XOR gate 20 while the signal D is high. The right sampler which includes latches 14 and 18 operates on a falling edge (i.e., a transition from "high" to "low") and the multiplexer presents the output from the XOR gate 22 while the signal D is low. The output signal PI is chosen between either MI' or MI" depending on which is currently valid.

The signal D may be clocked (retimed) with the Q clock, using both edges and two flip flops. A phase detector characteristic diagram is illustrated in FIG. 3. The characteristic shows that the detector is a saturating type with a range of $\pm\pi/2$. It is useful for implementing "bang-bang" or "best effort" control.

As described above, in this aspect of the present invention, a reference clock in quadrature with the main clock is used to discriminate between phase error signals at the rising edge and those generated at the falling edge of the clock.

The general concept which is embodied in the specific circuit of FIG. 1 can be generalized as illustrated in the block diagram of FIG. 4. In a general a clock signal CLK and a marker (or reference) signal MARK are provided. The CLK signal is a general representation of the signal I and the marker MARK signal is a general representation of the signal Q. As previously discussed, it is preferable that the clock CLK signal be 90 degrees out of phase with the marker signal to maximize the range of the phase detector. However, the phase difference is not necessarily critical if that benefit is not required.

The clock and marker signals CLK and MARK are provided to a sampler circuit 50. The sampler circuit 50 functions to provide the sampled version of the clock and marker signal under the control of the data signal D. The function of the sampler circuit 50 is performed by the latches 12, 14, 16, and 18 in FIG. 1.

It should be noted that the data signal D really need not be a data signal at all. In one embodiment the data signal D is a periodic clock signal. The signal D is referred to as a data signal throughout this patent only to simplify the discussion and avoid confusion with the signals I and CLK which are referred to as a "clock" signals. There are many other phase detectors that can work with a clock signal D, the phase detector of the present invention can work with either a clock or data signal D.

The sampler circuit 50 generates sample outputs (e.g., a sampled clock signal and a sampled marker signal) and provides these to a sign modifier circuit 52. In the preferred embodiment, four sample outputs are generated (e.g., I', Q', I", and Q" of FIG. 1). The sign modifier circuit 52 is used to keep track of whether the nearest edge of D is a rising or a falling edge. In FIG. 1, the sign modifier circuit 52 is accomplished by the XOR gates 20 and 22.

The sign modifier circuit 52 generates a command signal which is provided to select circuit 54. In the preferred embodiment, two command signals are generated (e.g., MI' and MI" from FIG. 1). The select circuit 54 is used to chose which of the two command signals is valid at any given time. This choice will be based upon the data signal D. For example, in the preferred embodiment, the select circuit 54 selects one of the command signals MI' or MI" if data signal D is at a low logic level and selects the other of the command signals MI' or MI" if data signal D is at a high logic level. In FIG. 1, the select circuit 54 is accomplished by the multiplexer 24.

As illustrated in FIG. 5, the select circuit 54 and the sign modifier circuit 52 may be switched. In other words, the output of sampler 50 may be coupled to the input of select circuit 54 and the output of select circuit 54 may be coupled to the input of sign modifier circuit 52.

Figure 6:
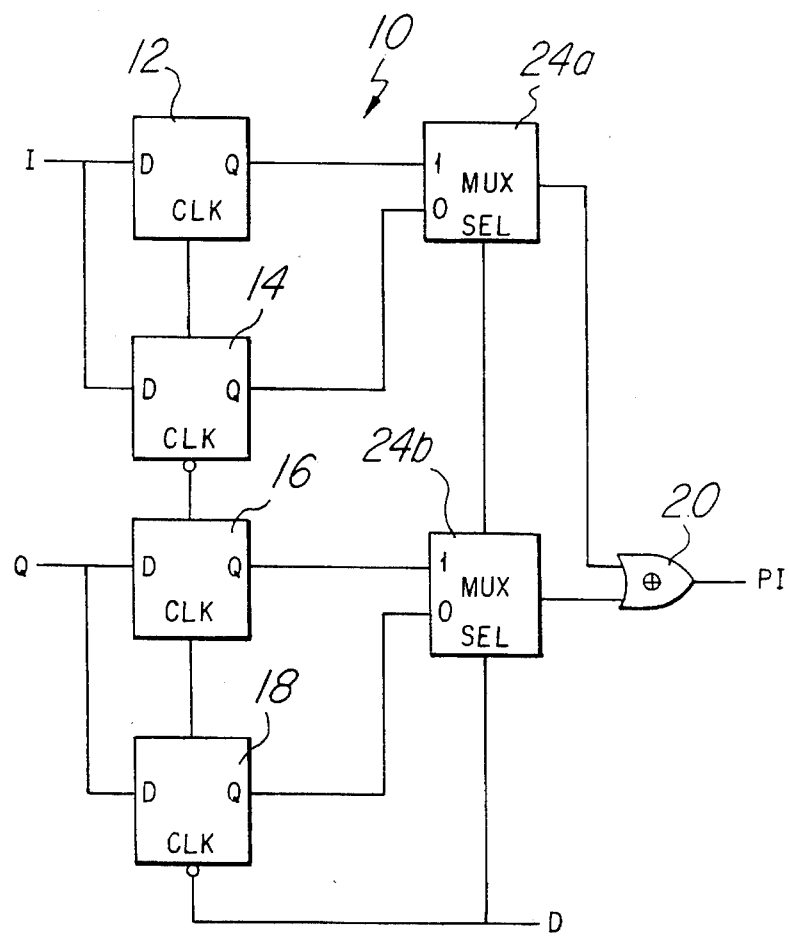
FIGS. 6–8 are schematic diagrams of alternate embodiment phase detectors.

A specific implementation illustrating an embodiment as diagramed in FIG. 5 is illustrated in FIG. 6. As in the circuit of FIG. 1, the clock signal I is coupled to the inputs of latches 12 and 14 and the marker signal Q is coupled to the inputs of latches 16 and 18. The output of latches 12 and 14 are coupled to the inputs of multiplexer 24*a* and the output of latches 16 and 18 are coupled to the inputs of multiplexer 24*b*. The outputs of multiplexers 24*a* and 24*b* are then coupled to the inputs of XOR gate 20.

Still other implementations of the general concept of the present invention can be developed. Two examples of these circuits are illustrated in FIGS. 7 and 8.

Figure 7:
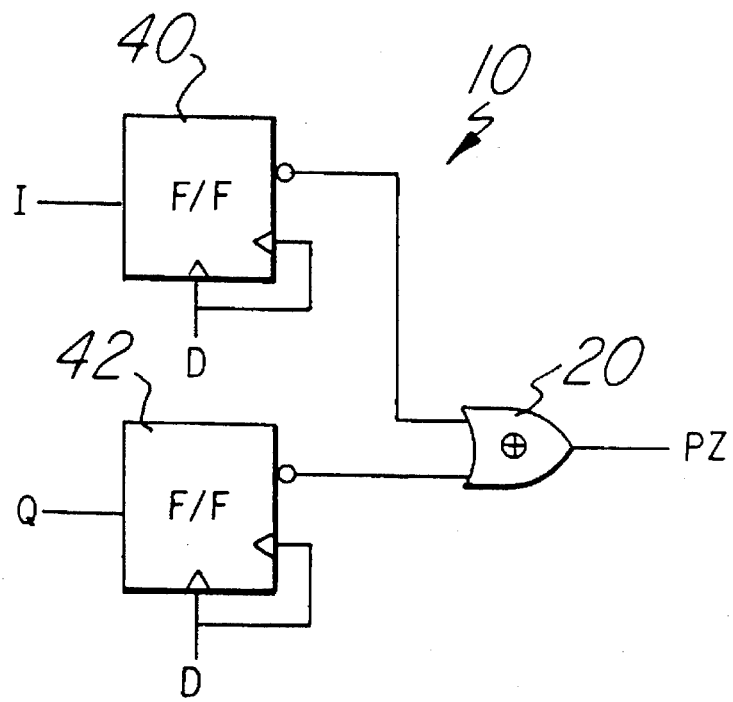

Referring first to FIG. 7, the function of both sampler circuit 50 and select circuit 54 (in FIG. 5) is performed by flip-flops 40 and 42. Flip-flops 40 and 42 are designed so that they latch the input at any transition (either rising or falling) in the clock input. The data signal D is coupled to the clock input. Comparing FIG. 7 to FIG. 6, the functions of latches 12 and 14 as well as multiplexer 24a are performed by flip-flop 40. Similarly, the functions of latches 16 and 18 as well as multiplexer 24b are performed by flip-flop 42.

Figure 8:
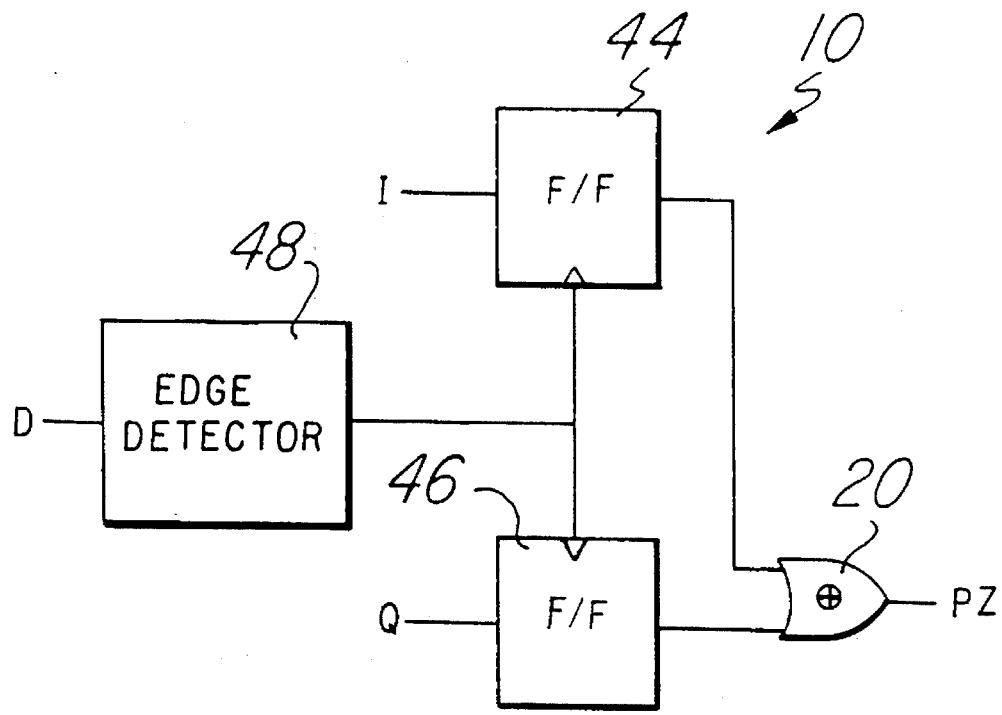

The circuit of FIG. 8 is similar to that of FIG. 7 except that an edge detector circuit 48 is also included. The edge detector circuit 48 is designed so that a short pulse is generated whenever the input signal transitions from high-to-low or from low-to-high (i.e., at either a rising or falling edge). When the edge detector 48 is included, the flip-flops 44 and 46 only need to latch the input at either the rising or falling edge of the clock input. This additional circuitry 48 eases the requirements on the flip-flops 44 and 46 since they will be required to detect only one of the transitions (i.e., either rising or falling edge).

Figure 9:
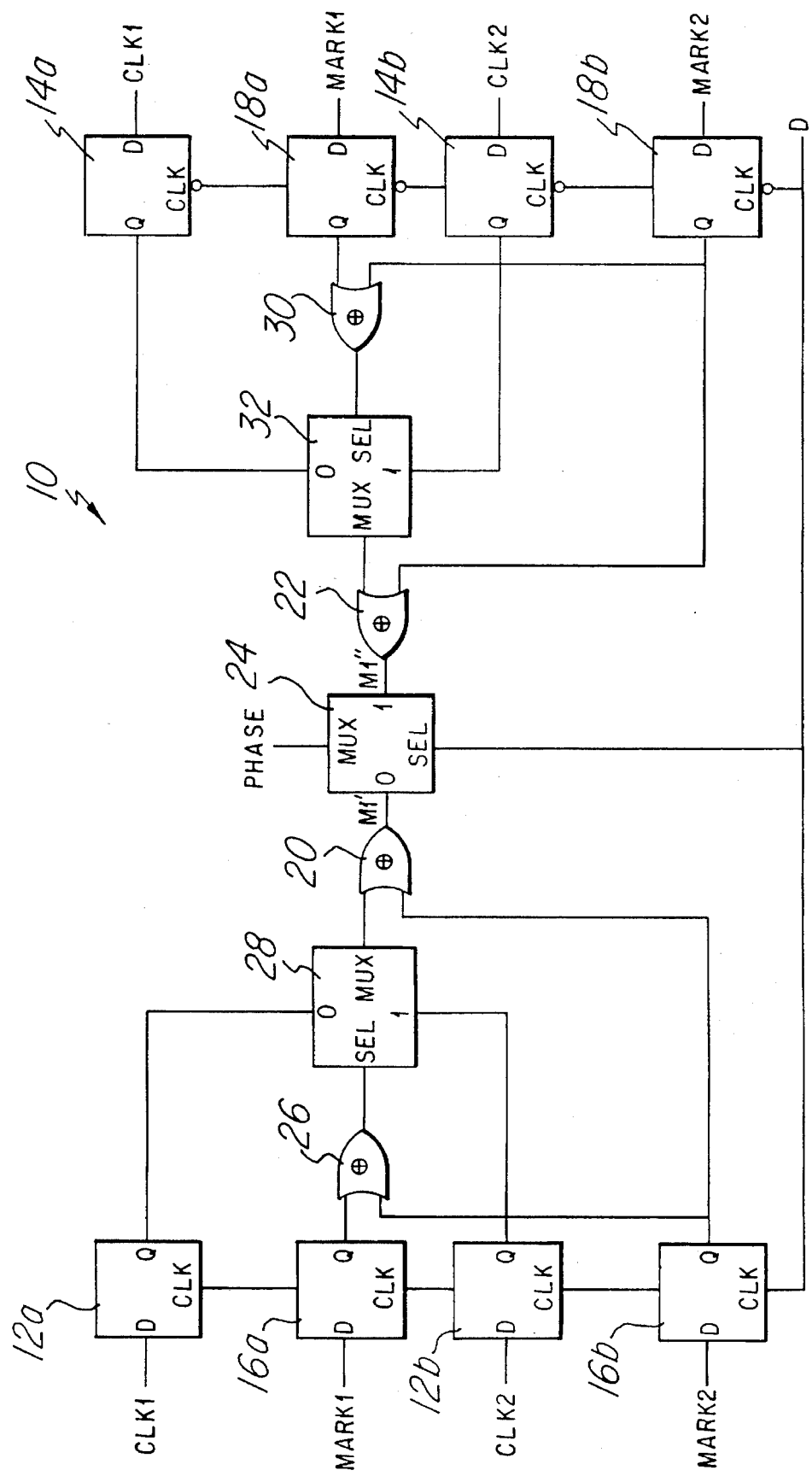
FIG. 9 is a schematic diagram of a second embodiment phase detector.
Figure 10:
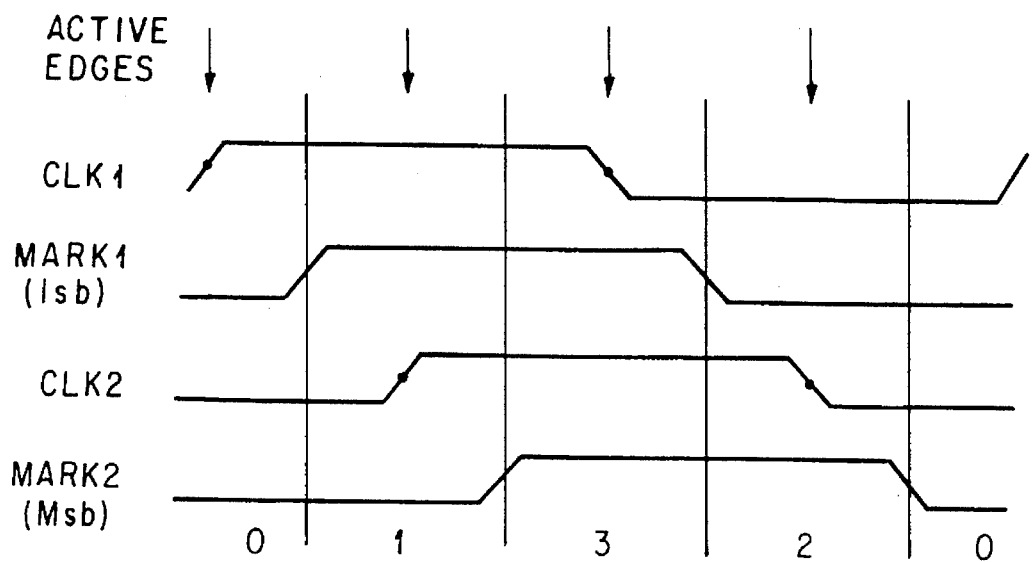
FIG. 10 is a timing diagram which is useful in understanding the operation of the circuit of FIG. 9.

The scheme can be easily generalized so that the frequency of the clocking signal I is less than the frequency of the data signal D. The half-baud case was illustrated in FIGS. 1 and 2. FIGS. 9 and 10 illustrate the analogous quarter-baud case. As will become clear, the other embodiments may also be modified to lower the clock frequency.

In the half-baud case, one bit was used to indicate in which of two positions the sample was taken. In a quarter-baud clock situation (i.e., frequency of I is half that of D), two bits would be needed to indicate in which of four positions the sample was taken. The concept can be expanded to other situations such as where the clock frequency is ¼ the data frequency or ⅛ the data frequency and so on.

FIG. 9 illustrates the circuit for a quarter-baud phase detector. The clocking inputs in this embodiment are CLK1, CLK2, MARK1 and MARK2. The signals CLK1 and CLK2 are analogous to signal I of the first embodiment described while the signals MARK1 and MARK2 are analogous to the signal Q.

In the circuit of FIG. 9, the outputs of latches 16a and 16b are coupled to XOR gate 26. The output of XOR gate 26 is coupled to the select input of multiplexer 28. The data inputs of multiplexer 28 are coupled to the outputs of latches 12a and 12b. The output of multiplexer 28 is coupled to one of the inputs of XOR gate 20 while the output of latch 16b is coupled to the other input of XOR gate 20.

Likewise, the outputs of latches 18a and 18b are coupled to the inputs of XOR gate 30. The output of XOR gate 30 is coupled to the select input of multiplexer 32. The data inputs of multiplexer 32 are coupled to the outputs of latches 12a and 12b. The output of multiplexer 32 is coupled to one of the inputs of XOR gate 22 while the output of latch 18b is coupled to the other input of XOR gate 22.

Although illustrated here by a specific circuit, the lower frequency phase detector can be generalized as before. The circuitry may be modified and still accomplish the general concept of the present invention.

In general, the XOR gates 20, 22, 26, and 30 provide a means for modifying the sign of the samples of CLK1 and CLK2 according to which of their edges the data transition is near. This modification is done to produce the proper command signal MI' or MI". The multiplexers 28 and 32 are used to sort out which clock signal CLK1 or CLK2 is currently being used. Other methods may also be feasible. As before, the multiplexer 24 is one method of generating the selected command signal PI from the currently valid command signal MI' or MI".

The operation of the circuit can be better understood with reference to FIG. 10. The sample position numbers 0–3 can be decoded to give the true command and polarity given the sample. The sample position numbers 0–3 are represented by MARK1 as the least significant bit (lsb) and MARK2 as the most significant bit (msb). The clock signals MARK1 and MARK2 can be used to do the actual retiming.

In the illustrated embodiment, the output of XOR gate 26 (or 30) selects which clock signal CLK1 or CLK2 will be examined. This selection is performed by multiplexer 28. The signal output from multiplexer 28 is now analogous to the signal I' of FIG. 1 while the signal output from latch 16b is analogous to signal Q' of FIG. 1. In other words, the reference signal MARK2 toggles polarity for both clock signals CLK1 and CLK2 just as the signal Q toggled the polarity of clock signal I. As before, the left side of the circuit operates on the rising edge of D while the right side of the circuit operates on the falling edge of D.

Figure 11:
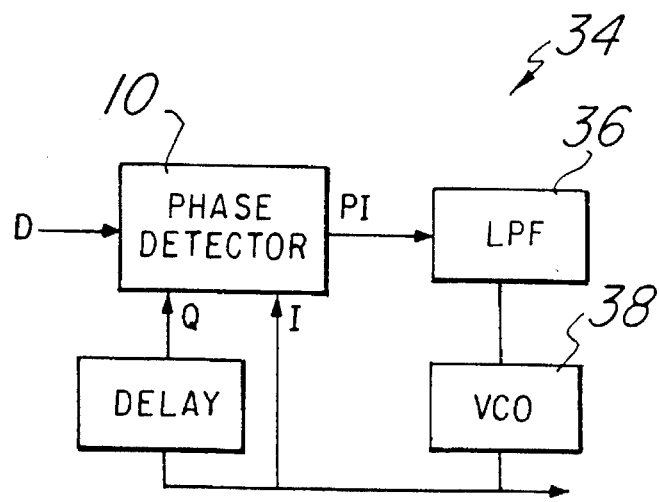
FIG. 11 is a block diagram of a phase lock loop circuit which can utilize the phase detector of the present invention.

The phase detector 10 can be used in a number of applications. One of these applications is a phase lock loop (PLL) circuit 34 as illustrated in FIG. 11. The output PI of phase detector 10 is coupled to the input of a low pass filter 36. The output of low pass filter 36 is in turn coupled to the input of voltage controlled oscillator (VCO) 38. The output of VCO 38 is the clocking signal I which can also be used for other functions in the overall circuit.

The phase lock loop 34 operates similarly to known phase lock loops. When the clock signal I transitions after the data signal D (i.e., the clock is late), the command signal PI is high. This high signal applied to VCO 38 in turn forces the frequency of signal I to increase so that clock signal I transitions earlier. When the signal I transitions too early, that is I transitions before D such that the clock signal is early, the command signal PI goes low. This low signal applied to VCO 38 forces the frequency of signal I to decrease thereby aligning the transitions with those of signal D. The circuit continues to operate using this type of control.

The phase detector of the present invention may be used in a number of other applications. One such application is a clock synchronizer.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A phase detector comprising:

sampler circuitry for receiving a clock signal, a marker signal and a data signal, wherein said marker signal comprises a delayed version of said clock signal, said sampler circuitry for generating a sampled clock signal and a sampled marker signal upon a transition in said data signal;

sign modifier circuitry for receiving said sampled clock signal and sampled marker signal, said sign modifier circuitry for comparing said sampled clock signal with said sampled marker signal to generate first and second command signals; and select circuitry for receiving said first and second command signals and said data signal, said select circuitry for generating a selected command signal based upon said data signal.

2. The detector of claim 1 wherein said sampler circuitry comprises a plurality of latches.

3. The detector of claim 1 wherein said sampler circuitry and select circuitry comprise a flip-flop.

4. The detector of claim 3 wherein said sampler circuitry and select circuitry further comprise an edge detector with an output coupled to a trigger input of said flip-flop.

5. The detector of claim 1 wherein said sign modifier circuitry comprises an XOR gate.

6. The detector of claim 1 wherein said select circuitry comprises a multiplexer.

7. The detector of claim I wherein said data signal comprises a periodic clock signal.

8. A phase detector comprising:

sampler circuitry for receiving a clock signal, a marker signal and a data signal, wherein said marker signal comprises a delayed version of said clock signal, said sampler circuitry for generating a sampled clock signal and a sampled marker signal upon a transition in said data signal;

select circuitry for receiving said sampled clock signal and sampled marker signal and generating a selected clock signal and a selected marker signal based upon said data signal; and sign modifier circuitry for receiving said selected clock signal and selected marker signal, said sign modifier circuitry for comparing said selected clock signal and said selected marker signal to generate a selected command signal.

9. The detector of claim 8 wherein said sampler circuitry comprises a plurality of latches.

10. The detector of claim 8 wherein said sampler circuitry and select circuitry comprise a flip-flop.

11. The detector of claim 10 wherein said sampler circuitry and select circuitry further comprises an edge detector with an output coupled to a trigger input of said flip-flop.

12. The detector of claim 8 wherein said sign modifier circuitry comprises an XOR gate.

13. The detector of claim 8 wherein said select circuitry comprises a multiplexer.

14. A phase detector for comparing phases of first and second signals, said phase detector comprising:

a first latch having a data input, a clocking input and an output, wherein said first signal is applied to said data input and said second signal is applied to said clocking input;

a second latch having a data input, a clocking input and an output, wherein a delayed version of said first signal is applied to said data input and said second signal is applied to said clocking input, said first and second latches latching a signal applied to the data input when said clocking input is a logical high;

a first XOR gate having first and second inputs and an output, said first input coupled to the output of said first latch and said second input coupled to the output of said second latch;

a third latch having a data input, a clocking input and an output, wherein said first signal is applied to said data input and said second signal is applied to said clocking input;

a fourth latch having a data input, a clocking input and an output, wherein said delayed version of said first signal is applied to said data input and said second signal is applied to said clocking input, said third and fourth latches latching a signal applied to the data input when said clocking input is a logical low;

a second XOR gate having first and second inputs and an output, said first input coupled to the output of said third latch and said second input coupled to the output of said fourth latch; and a multiplexer having a first data input coupled to the output of said first XOR gate and a second data input coupled to the output of said second XOR gate.

15. The phase detector of claim 14 wherein:

the output of the first latch is coupled directly to the first input of the first XOR gate; and the output of the third latch is coupled directly to the first input of the second XOR gate.

16. A phase detector comprising:

first and second latches each having an data input, a clocking input and an output, said first and second latches latching a signal applied to the data input when said clocking input is a logical high;

a first XOR gate having first and second inputs and an output, said first input coupled to the output of said first latch and said second input coupled to the output of said second latch;

third and fourth latches each having an data input, a clocking input and an output, said third and fourth latches latching a signal applied to the data input when said clocking input is a logical low;

a second XOR gate having first and second inputs and an output, said first input coupled to the output of said third latch and said second input coupled to the output of said fourth latch; and a multiplexer having a first data input coupled to the output of said first XOR gate and a second data input coupled to the output of said second XOR gate;

wherein the output of the first latch is coupled to the first input of the first XOR gate through a second multiplexer; and the output of the third latch is coupled to the first input of the second XOR gate through a third multiplexer.

17. The phase detector of claim 16 and further comprising:

fifth and sixth latches each having an data input, a clocking input and an output, said fifth and sixth latches latching a signal applied to the data input when said clocking input is a logical high;

a third XOR gate having first and second inputs and an output, said first input coupled to the output of said sixth latch and second input coupled to the output of said second latch;

said second multiplexer having a first data input coupled to the output of said first latch and a second data input coupled to the output of said fifth latch and a select input coupled to the output of said third XOR gate, wherein said second multiplexer has an output coupled to the first input of the first XOR gate;

seventh and eighth latches each having an data input, a clocking input and an output, said seventh and eighth latches latching a signal applied to the data input when said clocking input is a logical low;

a fourth XOR gate having first and second inputs and an output, said first input coupled to the output of said eighth latch and second input coupled to the output of said fourth latch; and said third multiplexer having a first data input coupled to the output of said third latch and a second data input coupled to the output of said seventh latch and a select input coupled to the output of said fourth XOR gate, wherein said second multiplexer has an output coupled to the first input of the second XOR gate.

18. A circuit comprising:

first and second latches each having an data input, a clocking input and an output, said first and second latches latching a signal applied to the data input when said clocking input is a logical high;

third and fourth latches each having an data input, a clocking input and an output, said third and fourth latches latching a signal applied to the data input when said clocking input is a logical low;

a first multiplexer with a first data input coupled to the output of said first latch and a second data input coupled to the output of said third latch;

a second multiplexer with a first data input coupled to the output of said second latch and a second data input coupled to the output of said fourth latch; and an XOR gate with a first input coupled to an output of said first multiplexer and a second input coupled to an output of said second multiplexer.

19. A method of detecting a phase difference between a first and a second signal, said method comprising the steps of:

generating a delayed signal from said first signal;

sampling said first signal at a transition of said second signal to generate a sampled first signal and sampling said delayed signal at said transition of said second signal to generate a sampled delayed signal;

generating a command signal by modifying said sampled first signal based upon said sampled delayed signal, said command signal modified so as to be at a first level when said first signal transitions before said second signal and at a second level when said first signal transitions after said second signal transitions.

20. The method of claim 19 wherein said sampling step comprises the step of generating first and second sampled signals and further comprising the step of selecting one of said first and second sampled signals.

21. The method of claim 19 wherein said step of generating a command signal comprises providing said first signal when said delayed signal is at a first level and inverting said first signal when said delayed signal is at a second level.

22. The method of claim 21 wherein said step of generating a command signal comprises the step of coupling said first signal and said delayed signal to an XOR gate.

23. A phase lock loop comprising:

a phase detector having first, second, and third inputs and an output, said phase detector comprising:

sampler circuitry for receiving a clock signal at said first input, a marker signal at said second input and a data signal at said third input, said sampler circuitry for generating a sampled clock signal and a sampled marker signal upon a transition in said data signal;

sign modifier circuitry for receiving said sampled clock signal and sampled marker signal, said sign modifier circuitry for comparing said sampled clock signal with said sampled marker signal to generate first and second command signals; and select circuitry for receiving said first and second command signals, said select circuitry for generating a selected command signal based upon said data signal, said selected command signal coupled to the output of said phase detector; a low pass filter with an input coupled to the output of said phase detector; and a voltage controlled oscillator with an input coupled to an output of said low pass filter and an output coupled to the first input of said phase detector.

24. The phase lock loop of claim 23 wherein said phase detector comprises:

first and second latches each having an data input, a clocking input and an output, said first and second latches latching a signal applied to the data input when said clocking input is a logical high;

a first XOR gate having first and second inputs and an output, said first input coupled to the output of said first latch and said second input coupled to the output of said second latch;

third and fourth latches each having an data input, a clocking input and an output, said third and fourth latches latching a signal applied to the data input when said clocking input is a logical low;

a second XOR gate having first and second inputs and an output, said first input coupled to the output of said third latch and said second input coupled to the output of said fourth latch; and a multiplexer having a first data input coupled to the output of said first XOR gate and a second data input coupled to the output of said second XOR gate.

25. The phase lock loop of claim 23 wherein said phase detector comprises:

first and second latches each having an data input, a clocking input and an output, said first and second latches latching a signal applied to the data input when said clocking input is a logical high;

third and fourth latches each having an data input, a clocking input and an output, said third and fourth latches latching a signal applied to the data input when said clocking input is a logical low;

a first multiplexer with a first data input coupled to the output of said first latch and a second data input coupled to the output of said third latch;

a second multiplexer with a first data input coupled to the output of said second latch and a second data input coupled to the output of said fourth latch; and an XOR gate with a first input coupled to an output of said first multiplexer and a second input coupled to an output of said second multiplexer.

26. A method of detecting a phase difference between a first signal and a second signal, said method comprising the steps of:

generating a marker signal which is a delayed version of said first signal;

sampling said first signal and said marker signal upon a low-to-high transition in said second signal to generate a first sampled first signal and a first sampled marker signal;

sampling said first signal and said marker signal upon a high-to-low transition in said second signal to generate a second sampled first signal and a second sampled marker signal;

generating a command signal by comparing said first sampled first signal with said first sampled marker signal when said second signal is at a high voltage level and comparing said second sampled first signal with said second sampled marker signal when said second signal is at a low voltage level.

27. The method of claim 26 wherein:

said first signal comprises clock signal;

said marker signal comprises a quadrature representation of said clock signal; and said second signal comprises a data signal.

* * * * *